United States Patent

[11] 3,600,705

[72] Inventors Wirojana Tantraporn Schenectady; Se Puan Yu, Schenectady; Paul J. Shaver, Scotia, all of, N.Y.

[21] Appl. No. 802,796
[22] Filed Feb. 27, 1969
[45] Patented Aug. 17, 1971
[73] Assignee General Electric Company

[54] HIGHLY EFFICIENT SUBCRITICALLY DOPED ELECTRON-TRANSFER EFFECT DEVICES
22 Claims, 15 Drawing Figs.

[52] U.S. Cl. .......... 331/107 G, 317/234 V, 330/5
[51] Int. Cl. .......... H03b 7/06
[50] Field of Search .......... 331/107; 317/234, 10; 330/5

[56] References Cited

UNITED STATES PATENTS

| | | | |
|---|---|---|---|
| 3,439,290 | 4/1969 | Shinoda | 331/107 |
| 3,509,478 | 4/1970 | Thim | 331/107 |

OTHER REFERENCES

Copeland; John A., IEEE Trans. on Elect. Dev., pgs. 461—463, Vol. ED- 14, No. 9, Sept. 1967, 331–107 G Denker; S. P., Electronics Letters, July 12, 1968, Vol. 4, No. 14, Pgs. 294— 295, 331–107 G

*Primary Examiner*—John Kominski
*Attorneys*—Paul A. Frank, John F. Ahern, Donald R. Campbell, Frank L. Neuhauser and Oscar B. Waddell

ABSTRACT: The subcritically-doped injection-current-limited (SDICL) microwave amplifier device comprises a bulk semiconductor having a doping density-length ($n_0L$) product below the critical value needed to sustain Gunn oscillation, in which the electric field is maintained approximately uniform above the threshold field in the vicinity of the cathode and elsewhere by limiting the injection of charge carriers. The injection current is limited by the conduction characteristics of the cathode structure or by tapering the bulk semiconductor. The SDICL device is DC stable, has high efficiency, is designed to operate over a wide range of frequencies, and can be connected directly in series or series-parallel for higher power levels in amplifier and oscillator circuits.

Inventors:
Wirojana Tantraporn,
SePuan Yu,
Paul J. Shaver,
by Donald R. Campbell
Their Attorney.

Inventors:
Wirojana Tantraporn,
SePuan Yu,
Paul J. Shaver,
by Donald R. Campbell
Their Attorney.

Inventors:
Wirojana Tantraporn,
SePuan Yu,
Paul J. Shaver,
by Donald R. Campbell
Their Attorney.

HIGHLY EFFICIENT SUBCRITICALLY DOPED ELECTRON-TRANSFER EFFECT DEVICES

This invention relates to solid state electron-transfer effect devices employed as highly efficient microwave amplifiers or oscillators. More particularly, the invention relates to subcritically doped injection-current-limited (SDICL) electron-transfer effect devices made of a semiconductor having a product of doping density and length below the critical value needed to sustain high-field domain oscillation, in which the electric field is kept above the threshold electric field over all or most of the length of the active device.

the generation of coherent microwave current oscillations in homogenous crystals of heavily doped N-type gallium arsenide subjected to high DC voltages exceeding the threshold voltage is commonly referred to as the Gun effect. It is well established that the mechanism responsible for the Gunn effect in appropriate semiconductors is associated with the transfer of "hot" electrons between conduction-band valleys separated in energy by a fraction of an electron-volt. The lower energy conduction-band valleys are the normal electron conduction bands, and an applied voltage that produces a sufficiently high electric field causes the "hot" electrons to transfer from the low energy, high mobility valleys to the higher energy, low mobility valleys where they become less effective in the conduction process. The transferred-electron mechanism gives rise to a voltage controlled bulk negative resistance so that the output current can decrease even though the applied electric field is held steady or increased. In the mode of operation originally discussed by Gunn, for samples of N-type gallium arsenide having an $n_oL$ product ($n_o$ =equilibrium charge carrier concentration, and $L$ =the length of the diode) greater than a critical value of about $10^{12}$/cm.$^2$, the application to the diode of an electric field in the negative resistance region causes a narrow high-field space charge dipole domain to form in the interelectrode space, usually at the cathode. The high-field domain grows to a stable configuration and travels toward the anode where it is collected, and a new high-field domain then forms at the cathode. The period of the resulting current oscillation is thus proportional to the transit time for the moving high-field dipole domain to traverse the length of the diode. The high-field region captures most of the applied voltage, and as a result the electric field in the remainder of the diode is decreased below the threshold value (see FIG. 1, which shows the electric field distribution as a function of length of the diode at an arbitrary time of interest). The low electric field in the cathode region, moreover, can be attributed to the high conductivity of the "ohmic" contact which creates a heavily doped $n^+$ region at the cathode end of the diode and injects sufficient electron charge carriers to keep the field low. As a result of the nonuniform field distribution, only a portion of the diode, namely, the portion having electric field values above the threshold field, generates radio frequency power. The remainder of the diode with low electric field values below the threshold is passive and dissipates RF energy.

Other modes of operation of electron-transfer effect devices having an above-critical $n_oL$ product achieve higher efficiencies as microwave oscillators by establishing a more uniform electric field distribution so that a greater portion of the device has field values above the threshold. These are the limited-space charge accumulation (LSA) mode and the so-called hybrid mode (see FIG. 1), and both require external resonant circuits to control the electron dynamics of the diodes. In the LSA mode, the external circuit superimposes on the DC bias voltage an RF voltage having a frequency greater than the transit-time frequency, and the total electric field across the diode rises from a value below the threshold field to a value more than twice the threshold value so quickly that the space charge distribution associated with a high-field dipole domain does not have time to form. The electron accumulation layer that is injected is quenched in the interelectrode space upon the downswing of the RF voltage to a point where the total field is below the threshold field. In the hybrid mode, partial domain formation takes place in a time period comparable to an RF cycle. An appreciable but not mature domain builds up as it traverses the active semiconductor, and domains exist in different degrees of formation during diode operation. With both of these modes of operation, as is also the case with the original Gunn mode, the field at the cathode side is below the threshold field, and the field distribution is unstable.

Another type of electron-transfer effect device is made from lightly doped semiconductor samples having a product of doping density and length less than the critical value needed to sustain Gunn oscillation. An ordinary subcritically doped device of N-type gallium arsenide having an $n_oL$ product of less than $10^{12}$/cm.$^2$ exhibits a nonuniform field distribution, when biased with electric fields above the threshold field, which is stable with respect to time and space. High-field domain formation is inhibited, and the electric field (see FIG. 1) increases continuously from the cathode to the anode. Due to the use of an "ohmic" cathode contact that is essentially nonblocking to electrons, there are an excess number of injected electrons at the cathode region and the electric field is below the threshold value over an appreciable portion of the diode. The device is stable, as opposed to a diode which supports Gunn oscillation, and can be used as an amplifier for signals having a frequency in the vicinity of the transit-time frequency and its harmonics. With enough positive feedback, the device can be employed in circuits as an oscillator. The efficiency is low because the electric field is low over much of the length of the diode and this portion dissipates RF energy. It would be desirable, in order to obtain higher efficiencies, to keep the electric field in the active region more uniform and above the threshold field. This has not been realized, however, especially in view of the fact that the ordinary subcritically doped diode, as well as the critically doped diodes that generate Gunn effect oscillations, have been reported in the known literature as having "ohmic" contacts.

Accordingly, an object of the invention is to provide a new and improved stable electron-transfer effect device made of a subcritically doped semiconductor material wherein the electric field over the entire length of the active device, or a larger portion of the length than achieved heretofore, is maintained above the threshold electric field so that it is highly efficient as a microwave amplifier or oscillator.

Another object is the provision of a new and improved subcritically doped electron-transfer effect device having a novel cathode structure that limits the injected charge carriers to thereby keep the electric field at or near the cathode end of the active semiconductor material above the threshold value.

Yet another object of the invention is to provide a new and improved broadband subcritically doped injection-current-limited electron-transfer effect device characterized by a substantially uniform electric field distribution, when biased above the threshold field, and greater freedom from transit-time frequency limitations.

A further object is to operate with improved efficiencies microwave circuits employing solid-state electron-transfer effect devices as the active components.

A still further object is to achieve higher microwave power levels in microwave amplifier and oscillator circuits by the use of an array of stable, subcritically doped electron-transfer effect devices.

In accordance with the invention, a high efficiency solid state microwave amplifier device comprises an anode structure and a cathode structure and an active body of bulk semiconductor material therebetween that exhibits the electron-transfer effect when biased above the threshold electric field and has an $n_oL$ product below the critical value needed to sustain Gunn oscillation, is characterized by a configuration for limiting the injection of charge carriers into the active semiconductor body to a desired value to maintain the electric field in the vicinity of the cathode structure and over the remainder of the length of the active semiconductor body above the threshold electric field. Preferably the active bulk semiconductor material is uniformly doped and the $n_oL$ product and value of injected charge carriers are chosen to maintain the electric field substantially uniform over all or most of the length of the active semiconductor body.

Injection current limitation is achieved by providing a cathode structure that embodies an electronic energy potential barrier of the appropriate height, or effects a space charge limitation of the injected current flow, or includes a semiconductor region whose conductivity can be regulated by external radiation impinging on the cathode structure. Other techniques can also be employed to limit the injection current such as by tapering the cross section of the active bulk semiconductor physically or in an electronically equivalent manner. Most commonly, the new electron-transfer effect amplifier device is a diode made of N-type gallium arsenide bulk semiconductor, and several can be connected in series or series-parallel to produce higher power levels in microwave amplifier and oscillator circuits.

The foregoing and other objects, features, and advantages of the invention will be apparent from the following more particular description of several preferred embodiments of the invention, as illustrated in the accompanying drawings wherein.

Figure 5:
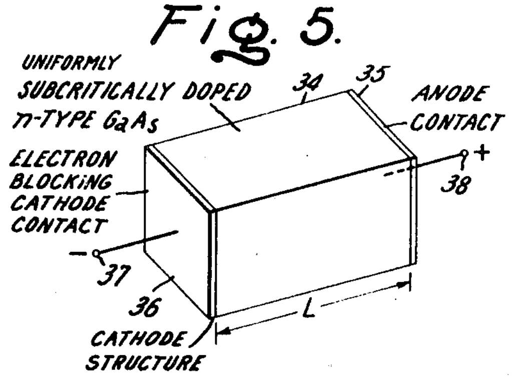
FIG. 5 is an isometric view of one embodiment or form of the SDICL diode in which the injection current limitation is achieved by a cathode structure having a charge carrier potential barrier.
Figure 6:
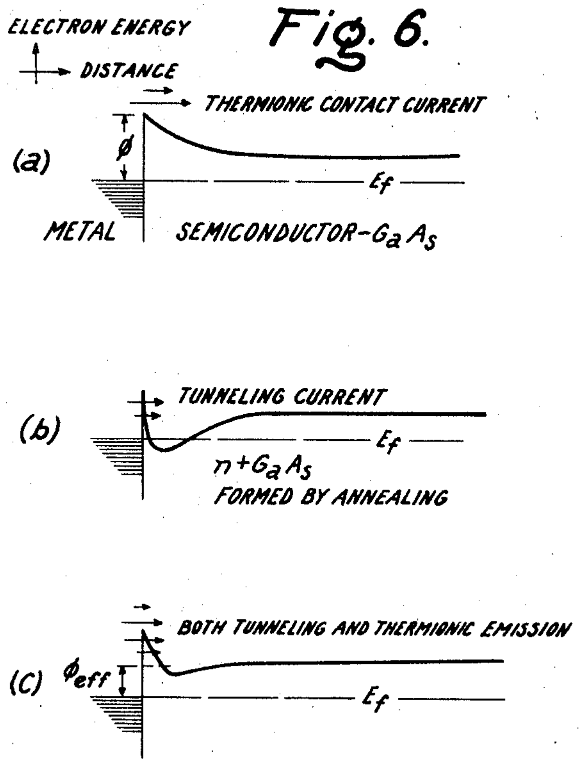

FIGS. 6*a* and 6*c* are diagrams of electron energy versus distance at a metal-semiconductor interface for two different methods of obtaining the barrier limitation of FIG. 5; FIG. 6*b* is similar to FIG. 6*a* but shows for sake of comparison the diagram when the diffusion is prolonged to obtain the prior art "ohmic" contact.

Figure 7:
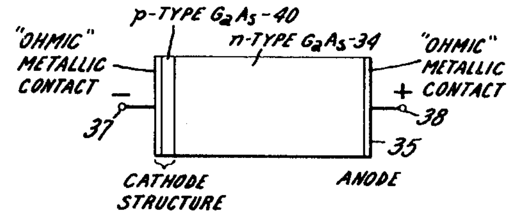
Figure 8:
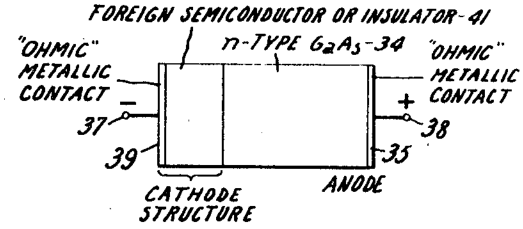
Figure 9:
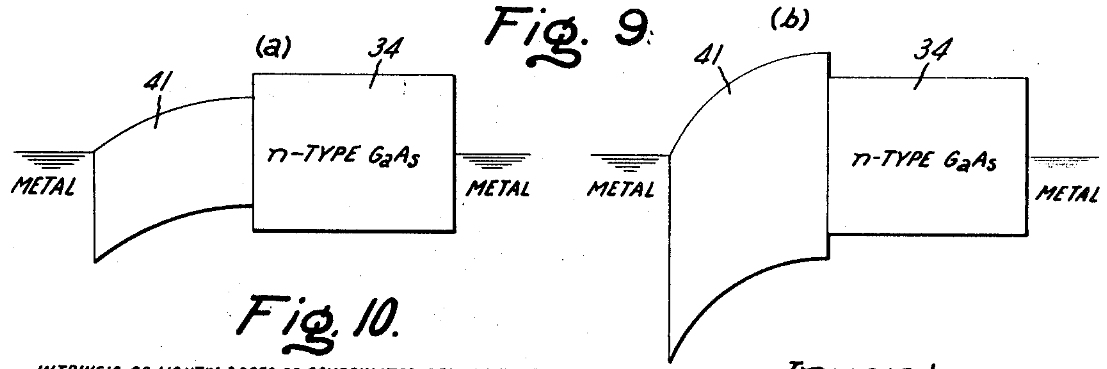
Figure 10:
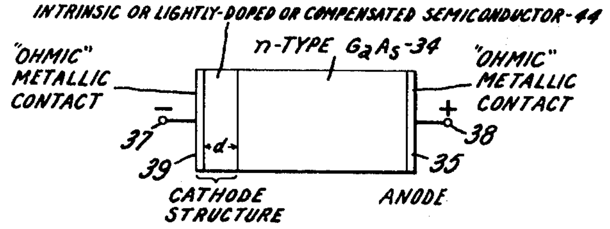
Figure 11:
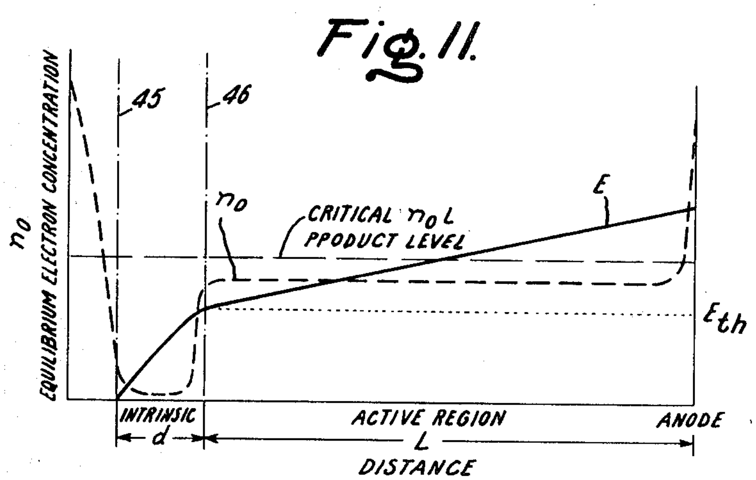
Figure 12:
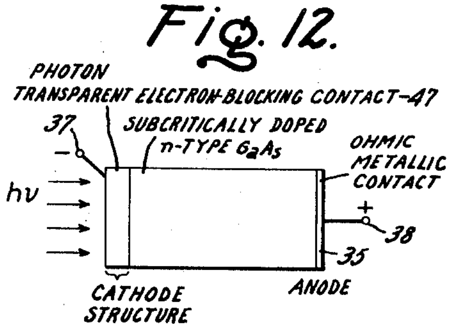
Figure 13:
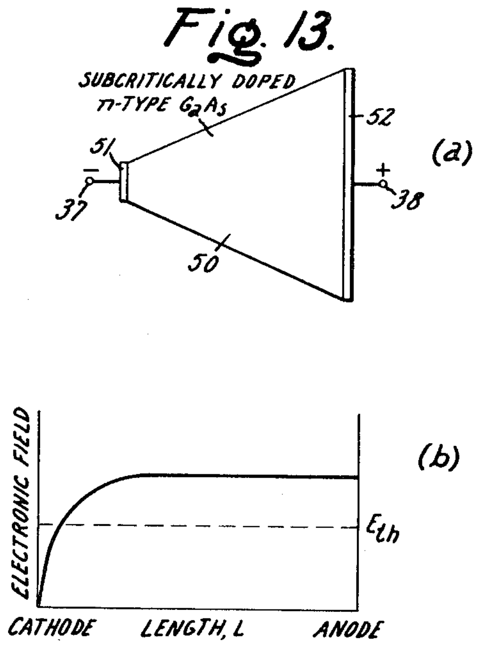
Figure 14:
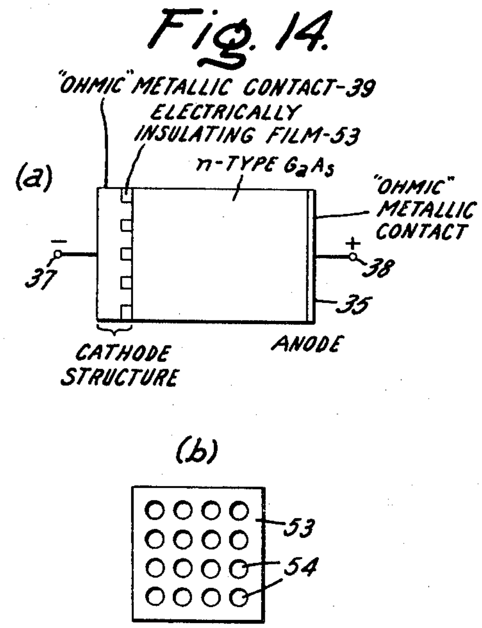
Figure 15:
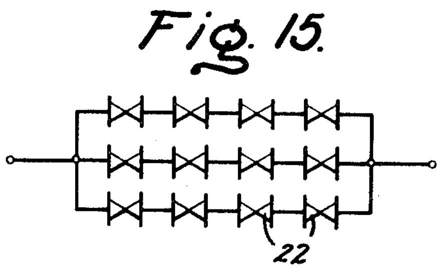

FIG. 7 shows a diagrammatic side view of another form of an SDICL diode with a cathode structure incorporating a PN junction;

FIG. 8 is a side view of an SDICL diode with a cathode structure incorporating a foreign semiconductor or insulator to form a heretojunction with the active material;

FIGS. 9*a* and 9*b* are electronic energy versus distance diagrams for the diode of FIG. 8 respectively including a foreign semiconductor and an insulator;

FIG. 10 is a side view of an SDICL diode with a cathode structure including an intrinsic or lightly doped or compensated semiconductor region;

FIG. 11 is a plot of charge carrier density versus length for the diode of FIG. 10, or one in which effectively the same result is achieved by varying the donor density at one end of the active semiconductor crystal;

FIG. 12 is a side view of an SDICL diode with a cathode structure that is controllable by external radiation;

FIG. 13*a* is a side view of a shaped subcritically doped diode, and FIG. 13*b* is a curve of electric field distribution versus length for this shaped diode;

FIG. 14*a* is a side view of an SDICL diode having a cathode structure that is the electronic equivalent of the shaped diode of FIG. 13*a*; FIG. 14*b* is a plan view of the electrically insulating film that is an element of the cathode structure; and FIG. 15 is a schematic circuit diagram of an array of SDICL diodes for achieving higher microwave power levels.

Figure 1:
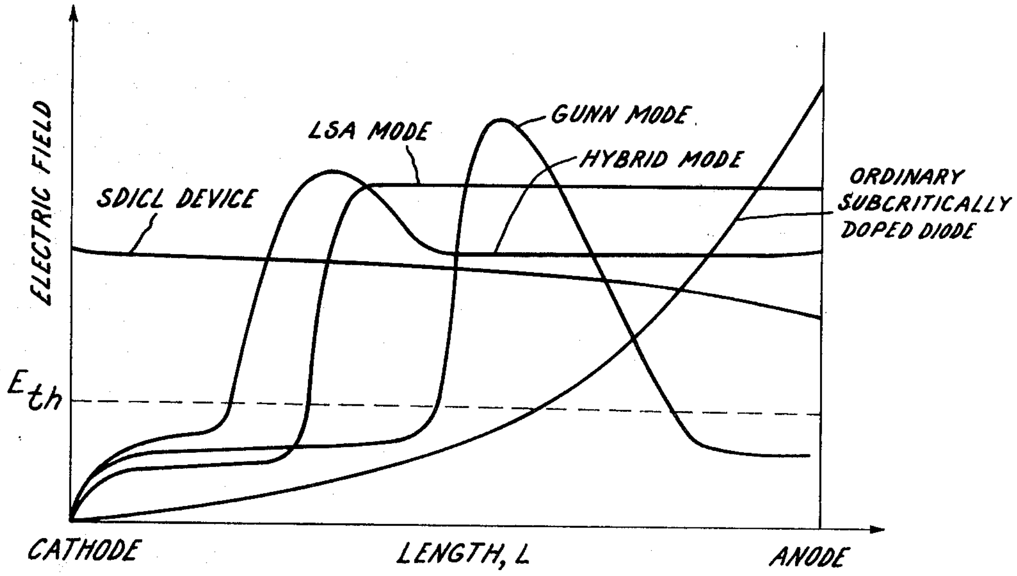
FIG. 1 is a diagram of electric field distribution versus length for several prior art critically doped and subcritically doped electron-transfer effect diodes, and for the new subcritically doped injection-current-limited (SDICL) diode.

Referring to FIG. 1, the new subcritically doped injection-current-limited (SDICL) electron-transfer effect device has an electric field distribution in the active bulk semiconductor between the cathode and anode regions that is substantially uniform at a value above the threshold field so as to fully take advantage of the negative differential mobility effect of such devices. Specifically, the electric field at or in the vicinity of the cathode is maintained above the threshold field for the particular bulk semiconductor material employed. Ideally, as is shown in FIG. 1, the electric field is above threshold throughout the entire active region including that part directly adjacent the cathode structure, but it is within the scope of the invention to maintain the electric field above threshold in the vicinity of the cathode as is illustrated in FIG. 13*b*, so that substantially the entire active region is above threshold even though the field adjacent the cathode is below threshold.

In accordance with the invention, it has been found that the electric field at or adjacent the cathode can be kept higher than the threshold value by limiting the injection current at the cathode. Limitation of the injection current is achieved by utilizing a current-limiting cathode structure that is blocking to injected electron charge carriers, as opposed to the "ohmic" cathode contacts used on prior art devices that are essentially nonblocking to electrons. In other embodiments of the invention, injection current limitation is realized by using the "ohmic" or nonblocking cathode contact but shaping the active bulk semiconductor either geometrically or in an electronically equivalent manner to effect the better field distribution. The electric field is kept nearly uniform over the entire length of the active region of the device, or substantially the entire length, by using a device made of a semiconductor material that exhibits the electron-transfer effect when biased with fields above the threshold value, but which has a doping density-diode length product below the critical value needed to sustain Gunn oscillation. That is, a diode having a subcritical $n_oL$ product is used, where $n_o$ is the equilibrium charge carrier density and $L$ is the length of the active bulk semiconductor. Since it can be shown by theoretical considerations that electron-transfer effect devices operate most efficiently as microwave generators when the electric field in the device is kept uniform over the entire active region with the device biased above the threshold voltage, it becomes clear that the aforementioned condition for efficient operation can now be achieved in a subcritically doped injection-current-limited electron-transfer effect device. Computational results on the SDICL device shown, indeed, that the device has an efficiency of about 15 percent when used an a broadband microwave amplifier. Another important property of the subcritically doped injection-current-limited device is that it is inherent stable and therefore can be used both as a microwave amplifier, or with positive feedback, as an efficient oscillator. The SDICL device, moreover, does not suffer from transit-time frequency limitations and is usable over a wide range of microwave frequencies. Because the new subcritically doped amplifier is DC stable, a plurality of SDICL devices can be connected together directly in an array, as for example to obtain higher microwave power levels.

In the preferred forms of the invention, the SDICL device is a two-terminal diode, however the invention is applicable as well to subcritically doped electron-transfer effect devices having three or more terminals, although most multiterminal devices to date have been basically devices for the production of Gunn oscillations where the control electrode or electrodes have been used to control the frequency of oscillation, change the waveform of the current or to trigger the oscillations. The term "diode", moreover, is used in the sense o f a two-terminal device as is common in this art, rather than in a more limited sense to identify a conventional solid-state diode with a rectifying junction.

As was previously mentioned, FIG. 1 also shows for purposes of comparison and contrast the electric field distribution as a function of length for a number of other prior art electron-transfer effect devices which will be reviewed briefly to clarify the advantages of the new SDICL device, and to clarify the meaning of the terms "subcritical $n_oL$ product" and "threshold electric field" for those unfamiliar with the art. As opposed to the SIDCL device in which the electric field is maintained above the threshold value in substantially the entire active region to thereby obtain greater stability and efficiency, these prior art devices have an electric field distribution that is below threshold over a substantial, if not major, portion of the active region. All of these prior art devices employ "ohmic" contacts that inject a large number of charge carriers into the cathode region, keeping the field of the cathode end of the device below the threshold value. These devices are inefficient as microwave amplifiers or oscillators because the portions of the devices below the threshold field do not generate microwave power. The ordinary subcritically doped diode having a subcritical $n_oL$ product is an amplifier device and is stable, but the three critically doped electron-transfer effect devices having a above-critical $n_oL$ product and operating respectively in the Gunn mode, the LSA mode, and the hybrid mode, are highly unstable and usually are used only as microwave oscillators. In FIG. 1 the electric field distribution for the three critically doped devices is shown at an arbitrary time of interest after the formation of a mature high-field domain (in the case of the Gunn mode operation), an immature high-field domain (in the case of the hybrid mode operation), or an electron accumulation layer (in the case of the LSA mode of operation), while these respective field disturbances traverse the length of the diode or a portion thereof toward the anode electrode. As has been pointed out, electron transfer-effect devices are commonly made of N-type gallium arsenide, and the critical $n_oL$ product for this semiconductor material is $10^{12}/cm^2$. Electron-transfer effect devices can also be made of other semiconductor materials having a similar electron configuration, such as cadmium telluride, indium phosphide, or zinc selenide, and since the critical $n_oL$ product above which Gunn oscillation occurs can be considered to be in the nature of a physical property of the particular semiconductor material, the critical $n_oL$ product for these materials is of course different from that for gallium arsenide.

Figure 2:
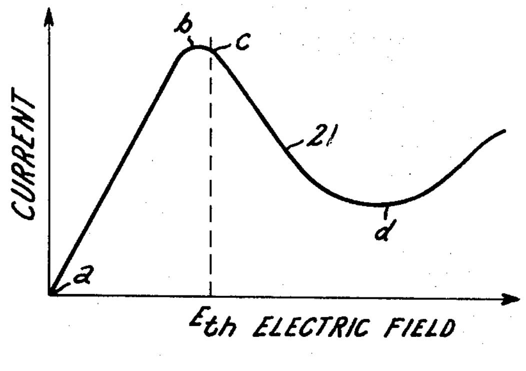
FIG. 2 is a typical negative resistance current-field characteristic for electron-transfer effect devices.

The significance of the threshold electric field $E_{th}$ for electron-transfer effect semiconductor materials in general will be reviewed briefly with reference to FIG. 2. When a DC biasing voltage is applied to an electron-transfer effect diode, the device at first substantially follows Ohm's law and the current increases in direct proportion to the electric field as the electric field is increased. Thus, the portion of the curves between the origin, point *a*, and the peak of the curve at point *b* at which maximum charge carrier velocity occurs is substantially linear, the charge carrier velocity being proportional to the electric field. Between the point *b* at which the maximum charge carrier velocity occurs and the point *c*, deviations from Ohm's law begin to be substantial and the device has begun to enter the negative differential resistance region. In the negative resistance region the charge carrier velocity decreases even though the electric field is being increased, and this is due to the electron-transfer effect previously described in which some electrons are transferred out of high mobility conduction band valleys into lower mobility valleys where they are less effective in the conduction process. The electric field at point *c* is known as the threshold field $E_{th}$, and is the minimum applied average field value at which the electron-transfer effect takes place. When the semiconductor material is critically doped, it is the minimum applied average field value at which the Gunn effect is observed. The biasing electric field must, of course, exceed the threshold field $E_{th}$ and furthermore is within the negative resistance region of the curve 21, i.e., the portion of the curve line generally between points *c* and *d*. For N-type gallium arsenide, the threshold field is about 3000 volts/cm.

Figure 3:
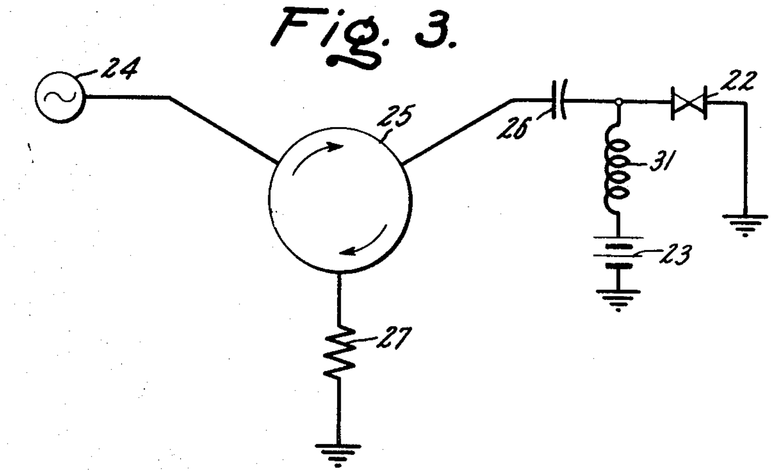
FIG. 3 and 4 are schematic diagrams of microwave circuit arrangements respectively utilizing the SDICL diode in an amplifier circuit and an oscillator circuit.
Figure 4:
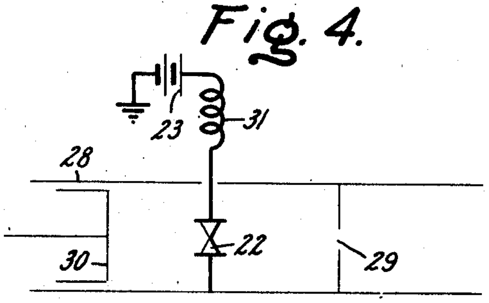

Before proceeding to a discussion of the construction of the subcritically doped injection-current-limited device and the different ways in which it can be realized, typical microwave circuits in which it can be realized, typical microwave circuits in which an SDICL diode is used an an amplifier and as an oscillator will be explained. FIG. 3 shows one way of employing the SDICL diode as a microwave amplifier, and it will be understood that there are numerous other possible circuit configurations. A positive DC biasing voltage above the threshold voltage is applied to one terminal of an SDICL diode 22 through an RF choke coil 31 by a suitable source of electric potential such as a battery 23, the other terminals of the diode 22 and source 23 being grounded. A microwave frequency signal generated by any convenient signal source 24 is applied through a three-port circulator 25 and a DC blocking capacitor 26 to the anode terminal of the SDICL diode 22. The amplified signal is returned through the blocking capacitor 26 and the circulator 25 and is supplied to the load 27, illustrated here as a grounded resistive load. In order for the SDICL diode to operate as a microwave oscillator, it is necessary to supply positive feedback. A typical microwave oscillator circuit is illustrated in FIG. 4. In this circuit, which again is illustratory of many that could be used, the SDICL diode 22 is mounted within a resonant cavity 28 having a coupling iris 29 at one end and a movable shorting block 30 at the other end. The battery 23 applies a positive biasing voltage above the threshold value through an RF choke coil 31 to the anode of diode 22, the cathode electrode being connected to a wall of the resonant cavity 28. In known manner, the resonant cavity 28 supplies positive feedback to the diode 22, and the oscillating output signal is coupled to an output conductor through the medium of the coupling iris 29.

It has already been explained that the implementation of the subcritically doped injection-current-limited electron-transfer effect device as a highly efficient stable microwave amplifier requires that a suitable semiconductor material be used having a subcritical $n_oL$ product, and that the cathode structure be designed such that the electric field at or near the cathode is sustained at a value above the threshold field for the semiconductor material used. By properly choosing the subcritical $n_oL$ product and the current level of injected charge carriers, the field in the diode can be maintained substantially uniform. The doping control of electron-transfer effect devices to obtain the desired $n_oL$ product is already well known. This involves, briefly, selecting the amount of donor impurity added to the semiconductor material during manufacture to dope it to the desired degree. An active region semiconductor material having a subcritical $n_oL$ product is commonly referred to as being lightly doped. An essential ingredient of the invention, then, boils down to various methods of constructing the cathode structure such that the electric field can be maintained above the threshold value in the active region semiconductor with a subcritical $n_oL$ product. That is, by causing the cathode structure to have a relatively low conductivity, the electric field reaches the threshold value in the very short distance within the structure, and the field in the active semiconductor body is everywhere above threshold. In the limit of the appropriately blocking contact, to be described below, the thickness of the cathode structure is zero.

There follows a description of various means for maintaining a desired high electric field at or near the cathode, which can be used either individually or in combination. While an attempt has been made to be complete, it will be understood that the invention is not restricted only to those particular cathode structures or other means that are specifically mentioned. The limitation of injection current is obtained by four general methods, namely, the creation of cathode barrier potential limitations, the development of pace charge limitations, use of external radiation, and geometrically shaping the active region semiconductor material either physically or in an electronically equivalent way. The various forms or embodiments of the invention shown in FIGS. 5—14 maintain the electric field at a substantially uniform value above the threshold field at or near the cathode and over the remainder of the length of the active region as is illustrated ideally in FIG. 1. The electric field need not have the same value or nearly the same value after having risen above threshold, but is much more nearly uniform than the field distribution for the prior devices (see FIG. 1).

In the several embodiments of the invention to be described, it is preferred that the active bulk semiconductor be uniformly doped, i.e., that it have a substantially constant equilibrium charge carrier density $n_o$, and that it have a uniform cross-sectional area. The length $L$ of the active bulk semiconductor is dependent on the desired frequency range and can be determined in any particular case, in a manner already known to those skilled in the art. The $n_oL$ product of any given sample must, of course, be below the critical value, and while there is a theoretical restriction on the lower limit, a suitable range is within two magnitudes of the critical value. For $n$-type gallium arsenide, whose critical $n_oL$ product is $10^{12}$/cm.$^2$, the $n_oL$ product then typically is between $10^{10}$–$10^{12}$/cm.$^2$. Likewise, the internal electric field produced in the active region is above the threshold field, whose value depends on the semiconductor material, and usually has an upper limit determined by the breakdown strength of the material. A range of two to three times the threshold value is suitable. For $n$-type gallium arsenide, having a threshold electric field of 3000 volts/cm., the internal electric field produced is typically between 3000–9000 volts/cm. Having determined in known manner the level of injection current required to maintain a chosen electric field strength, the physical dimensions and characteristics of the various elements of the cathode structures hereafter described can be ascertained by known techniques, and therefore will not be set forth in great detail. Furthermore, the exact dimensions, doping levels, and so on in any particular case depends on the physical characteristics of the active region, which in turn depends on the desired frequency range. It will therefore be sufficient to those skilled in the art to indicate relative or approximate dimensions, doping levels, temperatures, and so on, since this information will enable them to practice the invention.

Control of the current of electrons injected by the cathode contact can be achieved by building an electron energy barrier into the cathode contact, which will then be "nonohmic" or electron blocking. The ideal energy barrier passes an electron current which is just large enough to support a high electric field in the vicinity of the cathode. Four suitable cathode structures that fall into this group will be discussed.

1. The structure of one embodiment of the SDICL diode having this type of cathode contact mechanism is illustrated in FIG. 5. The active region of the diode comprises a body 34 of a suitable subcritically doped electron-transfer effect semiconductor material such as an N-type gallium arsenide, indium phosphide, cadmium telluride, or zinc selenide. Preferably, the active semiconductor body 34 is made of subcritically, uniformly doped N-typed gallium arsenide, and has a rectangular parallelepiped geometry with a substantially constant square or rectangular cross section. While not always specifically mentioned, the other embodiments of the invention also have an active region of similar physical configuration. A metallic contact 35 is formed on the anode end of body 34 using techniques known in the art. Most commonly, the anode contact 35 is an "ohmic" contact and can be made, for instance, of tin that diffuses into the anode region and results in heavily doping this end of body 34. The cathode contact 36, on the other hand, in accordance with this embodiment of the invention is an electron-blocking or "nonohmic" metallic contact (gold is one such metal) that is applied to the cathode end of the semiconductor body 34 by any suitable process that achieves the electron potential barrier to be described. If desired, a lead wire can be connected to the cathode contact 36 to define a negative terminal 37, while another similar lead wire is fastened to the anode contact 35 and defines the positive terminal 38.

The electron energy barrier that limits the injection of charge carriers into the semiconductor body 34 is more particularly a metal-semiconductor potential barrier of an appropriate height, Φ, known in the art as a Schottky barrier. The Schottky theory for the contact between a metal and a semiconductor states that a physical barrier layer is formed at the metal-semiconductor interface, and is to be distinguished from chemical barrier layers that may be present as a result of chemical preparation. The electronic energy barrier is formed when the effective work function of the semiconductor, defined as the energy difference between its Fermi level and the vacuum level, is less than the effective work function of the metal, so that electrons flow from the semiconductor into the metal until the Fermi levels match when the two are brought into contact. The Fermi level, $E_f$, is defined as the energy at which the probability of occupancy of an energy level is one-half. Since electrons are lost to the metal, the metal acquires a negative surface charge and the semiconductor charges up positively over a region that extends into the semiconductor and is referred to as the Schottky depletion layer. The potential barrier that is created at the interface is illustrated diagrammatically in the energy diagram in FIG. *6a*, in which energy in electron volts is plotted against distance as the abscissa, and the solid line to the right of the interface represents the bottom of the conduction band. The value of the barrier Φ is influenced by the interface states at the metal-semiconductor contact, not discussed above, as well as the work function of the metal, and the electron affinity of the semiconductor. Hence, there usually exist discrepancies between theoretical and experimental results, and the matching of materials to get a desired value of Φ has to be done experimentally depending on the semiconductor used and the bulk and surface impurities. This is especially true of a metal-GaAs system. A general survey, including experimental results, on the metal-semiconductor surface barrier according to the Schottky theory is given in the *Journal of Applied Physics*, Vol. 47, No. 6, pps. 2,458–2,467, May 1966, in an article by Geppert, Cowley, and Dore, entitled "Correlation of Metal-Semiconductor Barrier Height and Metal Work Function; Effect of Surface States."

For a metal-semiconductor energy barrier of height Φ, the maximum electron current $J$ passing over the barrier under the influence of an electric field $E$ at the barrier is given by $$J = AT^2 \exp[(\beta\sqrt{E} - \phi)/kT],$$

where $A$, $k$, and $\beta$ are constants and $T$ the temperature. (For further information on the above equation, reference may be made to the article by one of the inventors, W. Tantraporn, entitled "Electron Current Through Metal- Insulator-Metal Sandwiches," published in *Solid State Electronics*, Vol. 7, pp. 81–91, 1964). It can be deduced from the equation that when Φ is small such as in an "ohmic" or nonblocking contacts $E$=0 can still allow a large limit on the current density. On the other hand, if Φ is large, $J$ will be very small at a given temperature, and $E$ would have to be very large at the barrier in order to allow a desired level of the current density. At an appropriate value of Φ, 0.28 ±0.05 electron-volts for gallium arsenide, the current density $J$ and the field value $E$ are in the range of interest. Such a contact allows the electric field in the gallium arsenide to be above the threshold value throughout the diode body 34, and hence is the most efficient configuration.

2. A second form of the current limiting contact structure embodies a metal-semiconductor electronic energy barrier of an appropriate height, Φ, as described in (1) above, obtained instead by the diffusion or ion implantation techniques. In order to understand this structure, the usual method of obtaining an "ohmic" contact by the diffusion technique will be explained with regard to the energy diagram shown in FIG. *6b*. When the cathode metal contact is a donor-type such as tin, heating the contact at relatively high temperatures of about 400° C. for several seconds causes the donor impurity to diffuse into the cathode region, whereby there is a heavily doped $n^+$ region immediately adjacent the interface. The barrier region is so thin that the electrons can move through it by the mechanism known as quantum tunneling instead of travelling over the barrier height. When a slight positive voltage is supplied to the anode, there are sufficient number of electrons in the conduction band near the cathode that a space-charge-limited current is produced, or an ohmic current depending on the level of conductivity of the bulk. As shown by the curve in FIG. 6*b*, there is a very narrow, essentially transparent cathode barrier, and such a contact is thus called an "ohmic" contact since a negligible voltage drop would be required near the cathode. The length of the arrows is representative of the magnitude of current at different energy levels. On the other hand, a tin contact on gallium arsenide produces a blocking contact (such as in FIG. 6*a*) before heat treatment and there is negligible current flow. Intermediate cases exist between these two extremes, such as that illustrated in FIG. 6*c*. This is obtained by heating the tin contact to a lower temperature than is required to produce an "ohmic" contact, in the range of about 200° C.—350° C. for a longer time (several minutes), and results in a diffused donor density in the cathode region of the active semiconductor body 34. The structure of the SDICL diode having this cathode mechanism is the same as is illustrated in FIG. 5. In this way the barrier thickness is in the range where the "thermionic" component of the current density over the barrier is of the same order as that tunneling through the barrier at energies lower than the barrier height. The tunneling component as a function of energy is smaller at lower energies and becomes negligibly small at energies below a level designated $\Phi_{eff}$ in FIG. 6*c*. In other words, only electrons having energies larger than $\Phi_{eff}$ can leave the metal and enter the conduction band of the semiconductor. The desired $\Phi_{eff}$ for gallium arsenide is 0.28 ±0.05 ev. Thus although the maximum barrier height $\Phi$ is too high to allow a sufficiently large "thermonic" current component, the shape of the barrier causes it to behave as if only a barrier height $\Phi_{eff}$ were present instead. According to the cited Tantraporn article, such a virtual barrier $\Phi_{eff}$ also yields a current density which is less temperature dependent and more field dependent than the metal-semiconductor barrier case described previously under (1) above. The desired intermediate barrier of FIG. 6*c* can be fabricated either by controlled contact annealing cycles or by ion implantation techniques.

3. Another embodiment of the invention achieves a smooth electronic energy barrier by using a cathode structure comprising a reverse biased PN junction. The active region semiconductor body 34 for this type of SDICL diode (see FIG. 7) is preferably made of subcritically, uniformly doped N-type gallium arsenide having a suitable "ohmic" anode metallic contact 35. The cathode structure comprises an "ohmic" cathode metallic contact 39 made for instance of zinc that is annealed into a thin region of P-type gallium arsenide. In general, the thin region of P-type semiconductor forming a part of the cathode structure is of the same material as the N-type semiconductor body 34 that makes up the active region. Such a PN junction is reverse biased during the operation of the SDICL diode. The current through a reverse biased PN junction requires a substantial field, the level of which is dependent on how the donor and acceptor charge carriers are distributed in the junction region as well as the thickness of the P region. For the device of interest, the thickness of the P region is a few microns and the hole concentration of the P region is of the same order as the electron concentration in the N region, which is $10^{15}$ cm.$^{1}$or less. The P-type cathode region 40 and the N-type active region 34 can, if desired, be fabricated in one continuous operation using conventional techniques already known in the art by proper doping control. For example, fabrication of such a junction for use as an injection limiter for an appropriate current level can be achieved by epitaxial growth, or by impurity diffusion techniques.

4. A cathode structure including a heterojunction, i.e., a junction at the interface of two different semiconductors, to provide an electronic energy barrier of a preselected height. It will be convenient to discuss at the same time other kinds of heterojunctions that do not have an electron barrier but instead possess a low electron mobility and induce a rapid rise in the electric field, and are accordingly more properly classifiable with the next general approach to realizing a cathode structure for an SDICL diode by the development of space charge limitations. The physical structure of this form of SDICL diode is shown in FIG. 8. The cathode structure for this embodiment comprises the "ohmic" metallic contact 39 applied to a region 41 made of an appropriate foreign, or different, semiconductor or an insulator. With an active region 34 made of N-type gallium arsenide, the cathode region 41 can be made for example of germanium or gallium phosphide or an insulator such as a very thin polymerized plastic film. Heterojunctions can be fabricated by conventional techniques; for instance, active region gallium arsenide may be grown epitaxially on a germanium semiconductor substrate.

FIGS. **9*a* and 9*b* show respectively the energy diagrams for the two cases when the foreign semiconductor or insulator cathode region 41 has a smaller bandgap than the active region 34, and a larger bandgap than the active region 34, assuming that there is an "ohmic" contact on the left. In these energy diagrams, which are conventional diagrams plotted as a function of distance longitudinally along the diode, the upper traces represent the bottom of the conduction band, whereas the lower traces represent the top of the valence band. In FIG. 9*a*, electrons encounter an energy barrier at the interface of cathode region 41 with the active semiconductor body 34. This is the situation for the germanium-gallium arsenide heterojunction, and the appropriate barrier height is 0.28 ±0.05 ev. Since there is a limitation of the injection of charge carriers, a high field above the threshold field is achieved. In FIG. 9*b* the cathode region 41 is made of a wide bandgap material. As can be observed from the energy diagram, there is no barrier, but the region 41 now has low electron mobility characteristics and induces a rapid rise of the electric field strength. This type of heterojunction occurs when gallium phosphide is doped to the same level as the bulk gallium arsenide. Alternatively, region 41** can be a very thin polymerized plastic film.

As has been indicated, the cathode structure whose energy relationships are illustrated diagrammatically in FIG. 9*b* is classifiable with the following way of constructing a cathode structure for the SDICL diode in which the desired injection current limitation is realized by the development of space-charge limitations.

5. The injection current is limited by including in the cathode structure an intrinsic or very lightly doped or compensated semiconductor region that effects a space charge limitation of the electron current transported through it. Referring to FIG. 10, the cathode metallic contact 39 is usually an "ohmic" contact but there are no restrictions as to this element of the cathode structure except that it should provide a copious supply of electrons. The intrinsic or lightly doped semiconductor region 44 has a length "*d*" that is desirably small with respect to the length of the active region 34. The intrinsic layer 44 acts to raise the internal electric field to about the critical field in a distance that is short with respect to the length of the diode. This is accomplished by a combination of IR drop and space-charge effects. Since the intrinsic region 44 dissipates power, the average voltage drop across it should be kept as small as possible. To minimize the effect of the total input power that is lost, the intrinsic layer should be no greater than 10 percent as thick as the active region 34. An intrinsic semiconductor is one that by definition has essentially no electrically active impurities or internal defects, although some hole and electron pairs are created by thermal energy at room temperature. The material has a high resistivity, and there are few free electrons to take place in the conduction process. In FIG. 11 the equilibrium electron concentration $n_o$ is plotted as a function of distance along the SDICL diode of FIG. 10. The cathode metallic contact is bounded roughly by the line 45 while the intrinsic region is bounded by the line 46. Within the cathode metallic contact, $n_o$ is high in order to supply a copious flow of electrons, and decreases to almost zero within the intrinsic region over the distance "*d*." *The equilibrium electron concentration* $n_o$ then rises and is substantially constant within the active region over a distance *L* at a value that is selected to be below the critical $n_0L$ product level. At the anode metallic cathode $n_o$ rises abruptly. The internal electric field *E* within the intrinsic layer increases from almost zero to the value of the threshold field $E_{th}$ at the cathode end of the active region and rises at a slower rate thereafter over the distance *L* to the anode contact.

The "intrinsic" layer 44 is made of a pure intrinsic semiconductor, a lightly doped semiconductor, or a compensated semiconductor. A compensated semiconductor is one that has both donor and acceptor-type impurities but in which the net effect is near zero. Assuming that the semiconductor body 34 is made of subcritically doped N-type gallium arsenide, the most direct approach to producing this type of diode structure is to make the "intrinsic" layer out of gallium arsenide. The "intrinsic" layer can be formed as a final step during the epitaxial growth of the N-type gallium arsenide. This can be accomplished by introducing a sudden drop in substrate temperature during vapor phase expitaxial growth or by doping with iron. The "intrinsic" region can also be formed by ion implantation techniques, for instance, by bombarding the gallium arsenide with hydrogen ions of energy greater than 50 thousand electron-volts.

The magnitude of ohmic currents and space charge currents are directly proportional to the local mobility of electrons. Thus, it is advantageous to reduce the electron mobility of the "intrinsic" layer to as a low a value as is possible. This will maximize the rate at which the electric field increases with distance through the "intrinsic" layer. With gallium arsenide, this can be accomplished by introducing as many deep lying, compensated ionized impurities as possible. A second approach is to build the "intrinsic" layer 44 out of a low electron mobility material such as gallium phosphide. This, of course, requires the fabrication of a heterostructure. Gallium phosphide can be epitaxially grown on gallium arsenide.

The advantages of a cathode structure including an "intrinsic" layer is that it is straightforward and is usually less temperature-sensitive than cathode structures that create an electron energy barrier. Although the "intrinsic" layer dissipates power, this effect as has been indicated can be minimized.

Injection current limitation realized by the impingement of external radiation on the cathode structure will now be discussed.

6. The cathode structure includes a normally electron-blocking contact barrier, and the charge carrier density is controlled externally by incident light quanta. The cathode structure for this embodiment of the SDICL diode (FIG. 12) includes a cathode contact 47 which is transparent to photons, blocking for electrons, and collecting for holes when negatively biased. Preferably, the cathode contact 47 is made of a semitransparent material such as tin oxide, and the source of incident light energy is directed normal to the cathode face. A suitable light source is a semiconductor junction laser or gas laser, and a typical thickness for the tin oxide contact is 1—10 microns. When photons of energy $h\nu$ are absorbed by the gallium arsenide immediately underneath the cathode contact 47, hole-electron pairs are generated at a rate dependent on the light intensity. Due to the normal polarity of the diode bias, the electrons so generated are accelerated in the gallium arsenide bulk and participate in the dynamic signal amplification process, while the holes are collected by the contact 47. The supply of electrons and hence the diode current is determined by the radiant intensity of the external source, since the cathode contact 47 is constructed to be electron blocking, that is, it injects a negligibly small current of electrons when negatively biased. Thus, the electric field adjacent to the cathode end of the active region 34 can be maintained at a level higher than the critical threshold field for the onset of negative resistance.

The cathode contact 47 also can consist of a mechanically perforated electron blocking metallic contact. The electron blocking metallic contact typically has a matrix of holes similar to the showing in FIG. 14*b*, or is provided with a plurality of parallel elongated slots. In this case, the radiant flux is directed through the small openings or perforations in the metal contact to impinge on the gallium arsenide in the immediate vicinity of the metal contact. Electron-hole pairs are generated as the impinging photons are absorbed by the gallium arsenide. The resulting electrons are swept into the active region of the semiconductor bulk and at the same time the holes are attracted to the metallic contact by the diode bias similar to the transparent electrode described above.

7. The charge carrier density in the cathode structure can also be controlled externally by controlling the operating temperature. For a diode prepared in accordance with methods (1) and (2) above, and incorporating a cathode electronic energy barrier, $\Phi$ as illustrated in FIGS. 6*a* and 6*c* the value of $\Phi$ may be too low, and thus the cathode supplies too large an electron flux to maintain a desired field. By lowering the operating temperature the flux is reduced and the desired field at the cathode can be maintained at the required current level at a properly chosen temperature. The converse holds true, that when $\Phi$ is too high, the device can be operated at a higher temperature, although a higher temperature may not be desirable due to other device considerations.

The following methods of realizing injection current limitation in an SDICL diode are implemented by tapering the cross-sectional area of the diode physically or in an electronically equivalent manner.

8. The average electric field can be raised appreciably above the threshold field over a major portion of the length of the SDICL device by tapering the geometrical cross section of the diode. Referring to FIG. 13*a* the active semiconductor body 50 has a relatively small cross-sectional area adjacent the metallic cathode contact 51, and the body 50 is tapered so that the cross-sectional area becomes increasingly larger up to the metallic anode contact 52. The active semiconductor body 50 is typically the frustum of a four-sided pyramid and consequently has a square cross section or is conical and has a circular cross section. But it can also be of other shapes so long as the cathode area is much smaller than the anode area. Since the total electric current through the device is continuous, making the cross-sectional area of the cathode region smaller than the cross-sectional area of the anode region raises the average electric field intensity in the vicinity of the cathode. That is, the cathode region will have a higher current density than an untapered diode with uniform cross-sectional area, and will therefore support a higher electric field. As is observed in FIG. 13*b*, the electric field intensity rises rapidly and is above the threshold field $E_{th}$ over the major portion of the length *L* of the active region of the diode.

The cross-sectional area of the cathode can be as small as 1/100 of the cross-sectional area of the anode. Tapers can be introduced by various forms of mechanical machining, such as grinding, sawing, electric discharge machining, and ultrasonic machining, or by chemically etching a diode that has suitably masked cathode and anode regions. The cathode and anode contacts 51 and 52 are preferably "ohmic" contacts. It is noted that geometrically tapered electron-transfer effect oscillators are sometimes referred to as Shoji diodes (see *Proceedings of the IEEE*, Vol. 55, No. 130, 1967), however, the Shoji tapered diode was critically doped and operated in the highjfield domain mode of Gunn oscillation.

9. Instead of geometrically tapering the active bulk semiconductor, the electronically equivalent method of limiting the injection current is to block off a portion of the cathode area and employ one or more electron-emitting cathode sites whose total area is small compared to the cross section and length of the bulk semiconductor. When properly constructed, the rate of rise of the electric field intensity as a function of distance from the cathode will then be several times faster than the rate of rise of the field for the usual space-charge-limited type cathode. Good results are achieved when the electron-emitting cathode area is about 20 percent of the anode area. The preferred configuration of the cathode structure (see FIGS. 14*a* and 14*b* ) has a matrix of equal-sized "ohmic" electron-emitting cathode spots obtained for example by depositing an insulating layer 53 on the active region crystal 34, forming a matrix of holes 54 in the insulating layer, and then depositing an "ohmic" metallic contact 39 to fill up the holes and coat the outer surface of the insulating layer. Only that portion of the "ohmic" contact 39 that contacts the active bulk semiconductor through the matrix of holes 54 injects charge carriers into the active region. There is, accordingly, a forced convergence of the electric current density lines to increase the electric field intensity. The integrated effect of the multiple cathode spots is to raise the internal electric field of the diode to above the critical value in a relatively short distance.

The insulating layer 53 can be made of silicon dioxide, photoresist, plastic film or other suitable material. To form the holes 54, the insulating film can be deposited over minute masking particles uniformly distributed over the cathode surface which are then removed to leave uniform holes of submicron diameter. Conventional photoresist techniques with films of silicon dioxide also give acceptable resolution. It is seen that the fabrication of such a "Swiss cheese" cathode structure is straightforward and can be accomplished using known techniques. This type of cathode structure is a form of multiple parallel emitter, and to prevent the occurrence of secondary breakdown due to thermal runaway of a single emitter area, it may be necessary to connect a small resistor in series with each cathode spot. This can be accomplished by controlling the sheet resistivity of the metallic contact 39.

In addition to the advantages of the individual subcritically doped injection-current-limited negative resistance devices previously mentioned, any number of SDICL diodes can be connected in series, parallel, or series-parallel arrays and operated without the need of additional circuitry. By connecting a plurality of SDICL diodes in series, or in series-parallel, the microwave power output is increased. FIG. 15 shows one possible series-parallel array for obtaining higher microwave power levels, and comprises three strings of four diodes each, the strings being connected in parallel circuit relationship to one another. As another illustration of the use of an array of SDICL diodes to obtain higher power levels, the amplifier and oscillator circuits of FIGS. 3 and 4 can be constructed using several diodes in series or series-parallel. It is noted that no additional circuitry is needed to operate an array of SDICL diodes, and specifically an external resonant circuit is not needed.

In summary, a highly efficient solid state microwave amplifier is based on the principle that by limiting the charge carriers injected through the cathode plane into the active region of subcritically doped electron-transfer effect semiconductor material, the electric field distribution can be maintained nearly uniformly above the threshold field over a greater portion of the length of the device when biased above the threshold voltage, thereby taking full advantage of the negative differential mobility characteristics. The subcritically doped injection-current-limited (SDICL) electron-transfer effect device is inherently stable, and is an efficient active device independent of external circuits when connected as an amplifier or, with positive feedback, as an oscillator. The new negative resistance amplifier here described has a high gain-bandwidth product. Although its frequency dependence is related to the transit time, its frequency range is not limited by the transit time and hence is determined by the circuit design rather than any frequency limitation of the device. Since the SDICL devices can be connected in any series-parallel combination, and each individual device has high efficiency, higher microwave power levels can be obtained.

While the invention has been particularly shown and described with reference to several preferred embodiments thereof, it will be understood by those skilled in the art that various changes in form and detail may be made therein without departing from the spirit and scope of the invention.

What we claim as new and desire to secure by Letters Patent of the United States is:

1. A solid-state microwave amplifier device comprising an anode structure and a cathode structure and an active body of bulk semiconductor material therebetween that microscopically exhibits the electron-transfer effect when biased with a selected electric field above the characteristic threshold electric field and is uniformly subcritically doped with an $n_0L$ product, where $n_o$ is the equilibrium charge carrier density and $L$ is the length of the active semiconductor body, below the critical value needed to support Gunn oscillation, wherein said cathode structure controls the injection of electrons into the active semiconductor body to a desired value to maintain the selected electric field in the active semiconductor body in the immediate vicinity of the cathode structure and over the remainder of the length of the active semiconductor body above the threshold electric field at a substantially uniform value, and said cathode structure further substantially maintains the equilibrium charge carrier density $n_o$ over most of the active semiconductor body.

2. A device as defined in claim 1 further characterized by being a diode having an active semiconductor body made of N-type gallium arsenide.

3. A device as defined in claim 2 wherein said cathode structure embodies means for providing an electron energy barrier of a selected height of less than about 0.33 electron-volts to control the injection of electron charge carriers into the active semiconductor body.

4. A device as defined in claim 3 wherein said cathode structure comprises an electron-blocking diffused metallic contact.

5. A device as defined in claim 3 wherein said cathode structure comprises an ion implantation-type electron-blocking contact.

6. A device as defined in claim 1 wherein said cathode structure embodies means for effecting a space charge limitation of the injected current flow to a desired level to thereby limit the injection of electron charge carriers into the active semiconductor body.

7. A device as defined in claim 6 wherein said cathode structure comprises a metallic contact that supplies a copious flow of electrons, and a region of intrinsic or lightly doped semiconductor having a selected thickness.

8. A device as defined in claim 6 wherein said cathode structure comprises a metallic contact that supplies a copious flow of electrons, and a region of compensated semiconductor having a selected thickness.

9. A device as defined in claim 1 wherein said cathode structure is responsive to external radiation to generate the desired number of injection charge carriers, and means for impinging the external radiation on said cathode structure.

10. A device as defined in claim 1 wherein said cathode structure embodies means for effecting current density compression of the injection current.

11. A device as defined in claim 10 wherein said cathode structure comprises a metallic contact that is nonblocking to electrons, and an electrically insulating layer having a matrix of holes interposed between the active semiconductor body and forming, through the holes, a plurality of electron-emitting cathode areas.

12. A solid state microwave amplifier circuit comprising a subcritically doped injection-current-limited electron-transfer effect device comprising at least an anode structure and a cathode structure and an active body of bulk semiconductor material therebetween having an $n_oL$ product, where $n_o$ is the equilibrium charge carrier density and $L$ is the length of the active semiconductor body, below the critical value needed to sustain Gunn oscillation, characterized by a cathode structure that controls the injection of charge carriers to a desired value to maintain the electric field in the active semiconductor body in the immediate vicinity of the cathode structure and over the remainder of the length of the active semiconductor body at an approximately uniform selected value above the threshold electric field, said cathode structure further substantially maintaining the equilibrium charge density $n_o$ over most of the active semiconductor body, means for biasing said electron-transfer effect device with a unidirectional voltage that produces the selected above-threshold electric field, means for applying to said electron-transfer effect device an electric signal to be amplified, and output means for receiving the amplified signal.

13. A circuit as defined in claim 12 further including positive feedback means whereby said circuit functions as an oscillator circuit.

14. A circuit as defined in claim 12 including a plurality of said subcritically doped injection-current-limited electron-transfer effect devices connected in series circuit relationship to achieve higher power levels.

15. A solid-state negative resistance amplifier device comprising an anode structure, a cathode structure, and an active body of bulk semiconductor material therebetween that microscopically exhibits the electron-transfer effect when biased with a selected electric field above the characteristic threshold electric field and has an $n_oL$ product, where $n_o$ is the equilibrium charge carrier density and $L$ is the length of the active semiconductor body, below the critical value needed to support Gunn oscillation, wherein said cathode structure controls the injection of charge carriers into the active semiconductor body to maintain the selected electric field in the active semiconductor body at an approximately uniform value above the threshold electric field in the immediate vicinity of said cathode structure and over the remainder of the length of the active semiconductor body.

16. A device as defined in claim 15 wherein said active bulk semiconductor material is selected from the group consisting of N-type gallium arsenide, cadmium telluride, indium phosphide, and zinc selenide.

17. A device as defined in claim 15 wherein said active bulk semiconductor material is gallium arsenide, and said cathode structure comprises a metallic contact that is partially blocking to electron charge carriers and provides an electronic energy barrier of less than about 0.33 electron-volts in the region of the metal-semiconductor interface.

18. A device as defined in claim 15 wherein said cathode structure comprises a metallic contact that is nonblocking to electron charge carriers and further comprises a region of the same semiconductor material as said active semiconductor body but of opposite conductivity-type, to thereby form a reverse biased PN junction that limits the injected charge carriers to the desired level.

19. A device as defined in claim 15 wherein said cathode structure comprises a metallic contact that is nonblocking to electron charge carriers, and further comprises a region of a foreign semiconductor or an insulator having a charge carrier energy barrier of a selected height.

20. A device as defined in claim 15 wherein said cathode structure comprises a metallic contact that is nonblocking to electron charge carriers, and further comprises a region of intrinsic or lightly doped or compensated semiconductor having a selected thickness to effect a desired space charge limitation of the injection current.

21. A device as defined in claim 15 wherein said cathode structure comprises a metallic contact that is nonblocking to electron charge carriers and makes electrical connection to only a selected portion of the cathode area of the active semiconductor body.

22. A solid state negative resistance amplifier device comprising an anode structure, a cathode structure, and an active body of bulk semiconductor material therebetween that microscopically exhibits the electron-transfer effect when biased with a selected electric field above the characteristic threshold electric field and has an $n_oL$ product, where $n_o$ is the equilibrium charge carrier density and $L$ is the length of the active semiconductor body, below the critical value needed to support Gunn oscillation, wherein said anode and cathode structures both comprise metallic contacts that are nonblocking to electron charge carriers, and said active semiconductor body is tapered so as to have a small cross-sectional area adjacent said cathode structure and a large cross-sectional area adjacent said anode structure in order to control the injection of charge carriers into the active semiconductor body to maintain the selected electric field in the active semiconductor body at an approximately uniform value above the threshold electric field in the vicinity of said cathode structure and over the entire remainder of the length of the active semiconductor body.

Disclaimer 3,600,705.—*Wirojana Tantraporn*, and *Se Puan Yu*, Schenectady, and *Paul J. Shaver*, Scotia, N.Y. HIGHLY EFFICIENT SUBCRITICALLY DOPED ELECTRON-TRANSFER EFFECT DEVICES. Patent dated Aug. 17, 1971. Disclaimer filed Dec. 29, 1972, by the assignee, *General Electric Company*.

Hereby enters this disclaimer to claim 22 of said patent.

[*Official Gazette March 27, 1973.*]

Notice of Adverse Decision in Interference

In Interference No. 98,033, involving Patent No. 3,600,705, W. Tantraporn, S. P. Yu and P. J. Shaver, HIGHLY EFFICIENT SUBCRITICALLY DOPED ELECTRON-TRANSFER EFFECT DEVICES, final judgment adverse to the patentees was rendered June 11, 1974, as to claims 1, 2, 6, 12 and 15.

[*Official Gazette December 24, 1974.*]

Disclaimer 3,600,705.—*Wirojana Tantraporn* and *Se Puan Yu*, Schenectady, and *Paul J. Shaver*, Scotia, N.Y. HIGHLY EFFICIENT SUBCRITICALLY DOPED ELECTRON TRANSFER EFFECT DEVICES. Patent dated Aug. 17, 1971. Disclaimer filed Aug. 29, 1974, by the assignee, *General Electric Company*.

Hereby enters this disclaimer to claims 1, 2, 6, 12 and 15 of said patent.

[*Official Gazette May 27, 1975.*]